(12) United States Patent
Flens et al.

(10) Patent No.: US 8,057,109 B2
(45) Date of Patent: Nov. 15, 2011

(54) TRANSCEIVER MODULE WITH DUAL PRINTED CIRCUIT BOARDS

(75) Inventors: Frank Flens, Campbell, CA (US); Chris Togami, San Jose, CA (US); Tat Ming Teo, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 168 days.

(21) Appl. No.: 12/468,790

(22) Filed: May 19, 2009

(65) Prior Publication Data

US 2009/0290619 A1 Nov. 26, 2009

Related U.S. Application Data

(60) Provisional application No. 61/128,337, filed on May 20, 2008.

(51) Int. Cl.
 *G02B 6/36* (2006.01)
 *H04B 10/00* (2006.01)
(52) U.S. Cl. ............... 385/92; 385/88; 398/138
(58) Field of Classification Search .................. None
See application file for complete search history.

(56) References Cited

U.S. PATENT DOCUMENTS

| | | | |
|---|---|---|---|
| 5,214,730 A | 5/1993 | Nagasawa et al. | |
| 5,743,785 A | 4/1998 | Lundberg et al. | |
| 6,085,003 A | 7/2000 | Knight | |
| 6,886,988 B2 | 5/2005 | Brown et al. | |
| 7,156,562 B2* | 1/2007 | Mazotti et al. | 385/92 |
| 7,217,043 B2* | 5/2007 | Schunk | 385/94 |
| 7,309,173 B2* | 12/2007 | Epitaux et al. | 385/92 |
| 7,731,432 B2* | 6/2010 | Theodoras et al. | 385/92 |
| 2002/0115342 A1 | 8/2002 | Stricot et al. | |
| 2004/0120660 A1* | 6/2004 | Go et al. | 385/92 |
| 2005/0254821 A1* | 11/2005 | Theodoras, II | 398/135 |
| 2005/0259994 A1 | 11/2005 | Zhang et al. | |
| 2005/0265650 A1 | 12/2005 | Priyadarshi et al. | |
| 2006/0262026 A1 | 11/2006 | Gainey et al. | |
| 2008/0226239 A1* | 9/2008 | Oki et al. | 385/92 |
| 2009/0290619 A1 | 11/2009 | Flens et al. | |
| 2010/0080518 A1 | 4/2010 | Teo et al. | |
| 2010/0296817 A1 | 11/2010 | Togami et al. | |

FOREIGN PATENT DOCUMENTS

| | | |
|---|---|---|
| EP | 0439939 | 9/1995 |
| EP | 09751521.7 | 5/2009 |
| JP | 09-171127 | 6/1997 |
| WO | 2009143293 | 11/2009 |

OTHER PUBLICATIONS

Chris Togami et al., Communications Module Integrated Boot and Release Slide, U.S. Appl. No. 12/685,916, filed Jan. 12, 2010.
Chris Togami et al., Simplified and Shortened Parallel Cable, U.S. Appl. No. 12/717,352, filed Mar. 4, 2010.
Tat Ming Teo et al., Latching Mechanism for a Module, U.S. Appl. No. 12/573,637, filed Oct. 5, 2009.
The International Search Report and the Written Opinion of the International Searching Authority, International Application No. PCT/US2009/044740, date of mailing Jun. 7, 2010.
Supplementary European Search Report completed Aug. 24, 2011 in connection with corresponding European Patent Application No. 09 75 1521 (5 pgs).

* cited by examiner

*Primary Examiner* — Tina Wong
(74) *Attorney, Agent, or Firm* — Maschoff Gilmore & Israelsen

(57) ABSTRACT

Transceiver modules with dual printed circuit boards. In one example embodiment, a transceiver module includes first and second printed circuit boards (PCBs), a transmitter, a receiver, and a flexible circuit. The first PCB is positioned in a first plane and the second PCB is positioned in a second plane. The transmitter and the receiver are both positioned in a third plane that is offset from the first and second planes. The flexible circuit includes conductive traces that allow electrical data signals to pass between the transmitter and the receiver and the first and second PCBs.

20 Claims, 5 Drawing Sheets

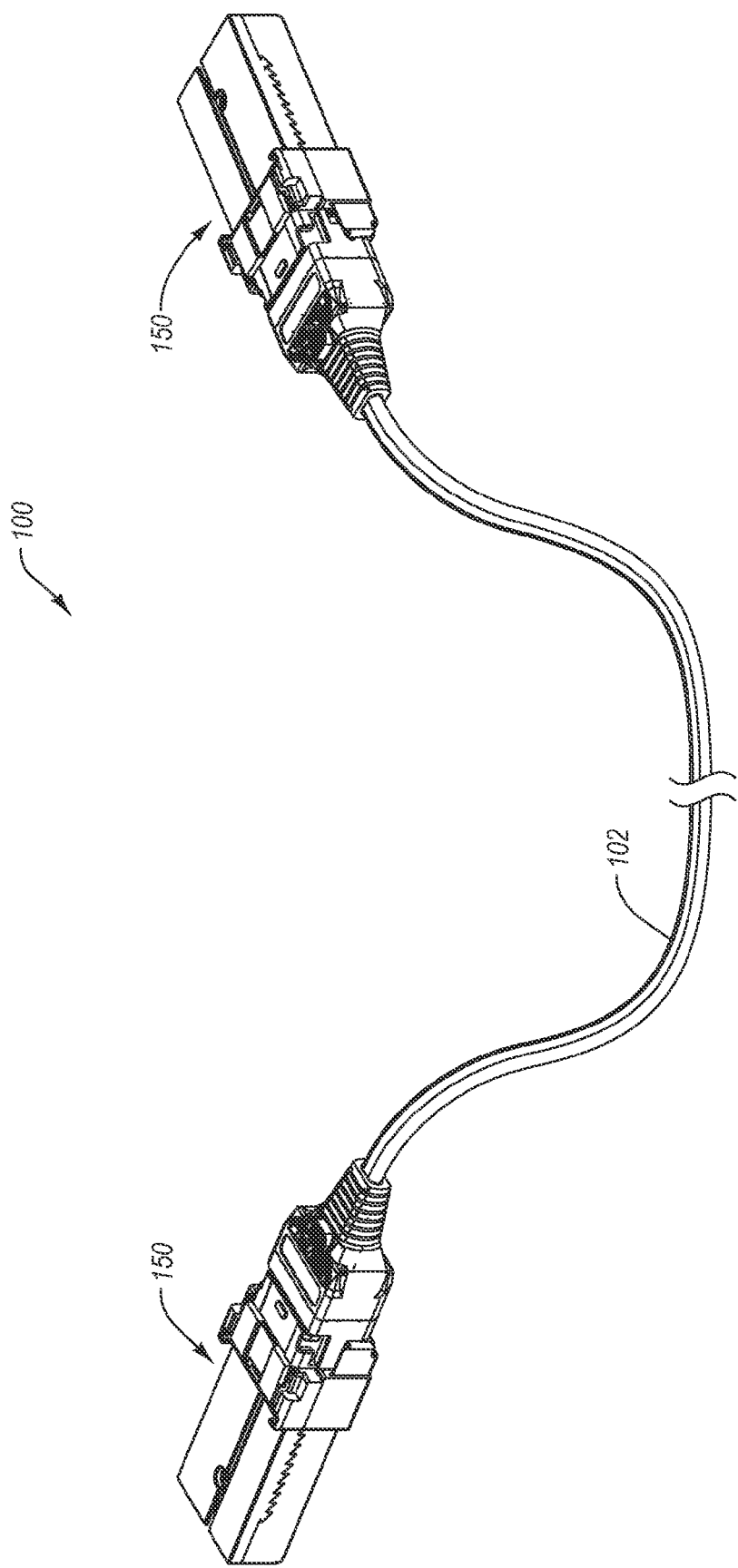

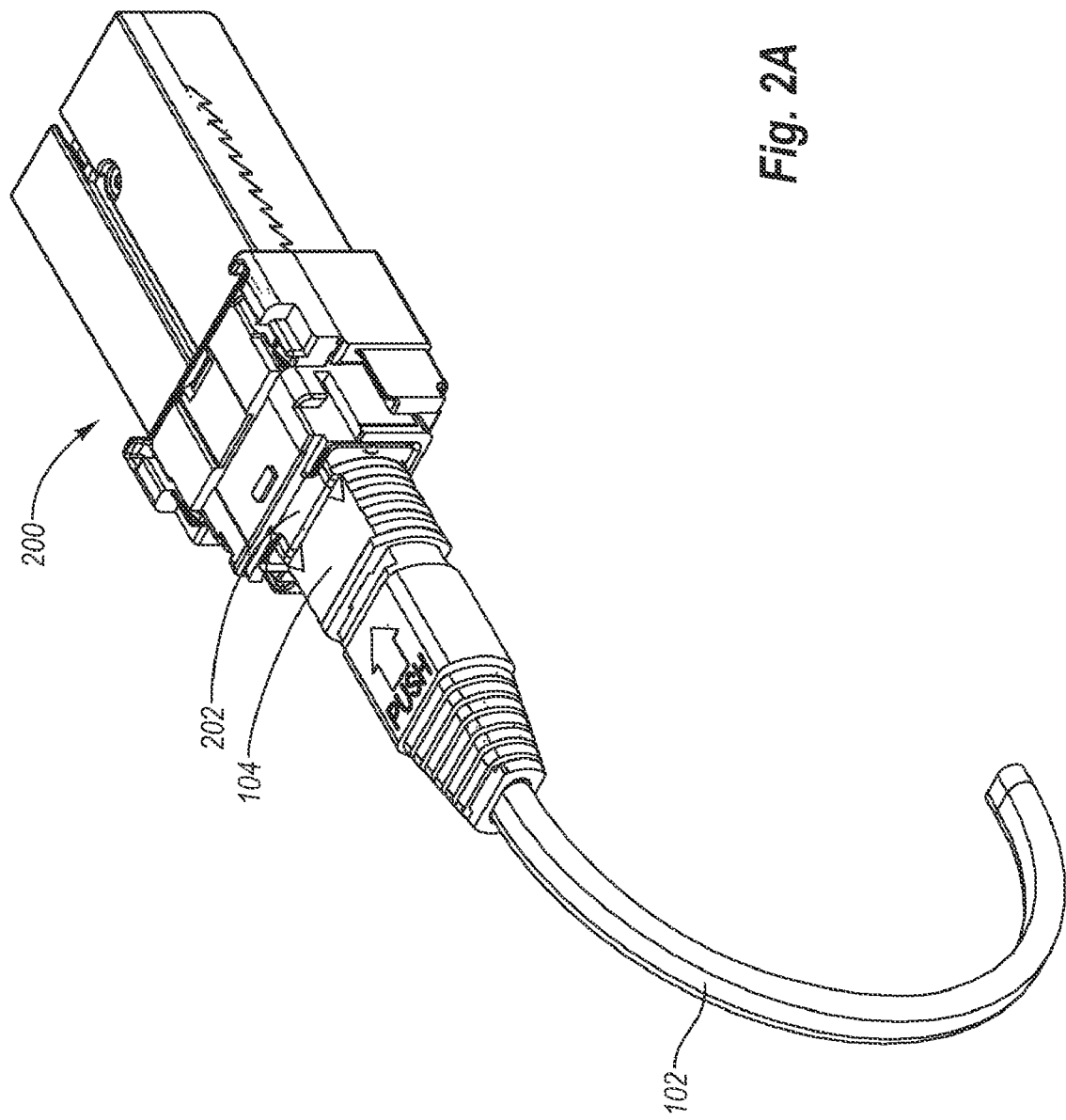

TRANSCEIVER MODULE WITH DUAL PRINTED CIRCUIT BOARDS

CROSS-REFERENCE TO A RELATED APPLICATION

The present application claims the benefit of U.S. Provisional Application Ser. No. 61/128,337, entitled "Flex connection for Dual-PCB Transceivers," filed May 20, 2008, which is hereby incorporated herein by reference in its entirety.

BACKGROUND

A transceiver module typically includes a transmitter, a receiver, and a printed circuit board (PCB) with circuitry related to the transmitter and the receiver, such as driving and amplifying circuitry. Electrical data signals generally pass through this circuitry as they pass between a host device in which the transceiver module is positioned and the transmitter and receiver.

One difficulty in transceiver modules is finding a reliable and cost effective means for passing electrical data signal between the transmitter and receiver and the PCB. In particular, the relatively small size and related space constraints of typical transceiver modules, and intervening components, can make passing electrical data signal between the transmitter and receiver and the PCB difficult.

BRIEF SUMMARY OF SOME EXAMPLE EMBODIMENTS

In general, example embodiments of the invention relate to transceiver modules with dual printed circuit boards. Some example transceiver modules disclosed herein enable electrical data signals to be passed between a transmitter and a transmitter PCB and between a receiver and a receiver PCB, even where the generally parallel planes in which the PCBs are positioned are offset from the plane in which the transmitter and receiver are positioned.

In one example embodiment, a transceiver module includes first and second printed circuit boards (PCBs), a transmitter, a receiver, and a flexible circuit. The first PCB is positioned in a first plane and the second PCB is positioned in a second plane. The transmitter and the receiver are both positioned in a third plane that is offset from the first and second planes. The flexible circuit includes conductive traces that allow electrical data signals to pass between the transmitter and the receiver and the first and second PCBs.

In another example embodiment, a transceiver module includes transmitter and receiver PCBs, a transmitter, a receiver, and means for passing electrical data signals between the transmitter and the transmitter PCB and between the receiver and the receiver PCB. The transmitter PCB is positioned in a first plane and the receiver PCB is positioned in a second plane. The transmitter and the receiver are both positioned in a third plane that is offset from the first and second planes.

In yet another example embodiment, an active cable includes a communications cable having first and second ends and first and second transceiver modules attached to the first and second ends of the communications cable, respectively. The communications cable includes one or more optical or electrical data transmission lines. Each transceiver module includes transmitter and receiver PCBs, a transmitter, a receiver, and a flexible circuit. The transmitter PCB is positioned in a first plane and the receiver PCB is positioned in a second plane. The transmitter and the receiver are both positioned in a third plane that is offset from the first and second planes. The flexible circuit includes conductive traces that allow electrical data signals to pass between the transmitter IC and the receiver IC and the first and second PCBs.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which:

FIG. 1 is a front perspective view of an example active cable;

FIG. 2A is a front top perspective view of an example transceiver module;

DETAILED DESCRIPTION OF SOME EXAMPLE EMBODIMENTS

Figure 2B:
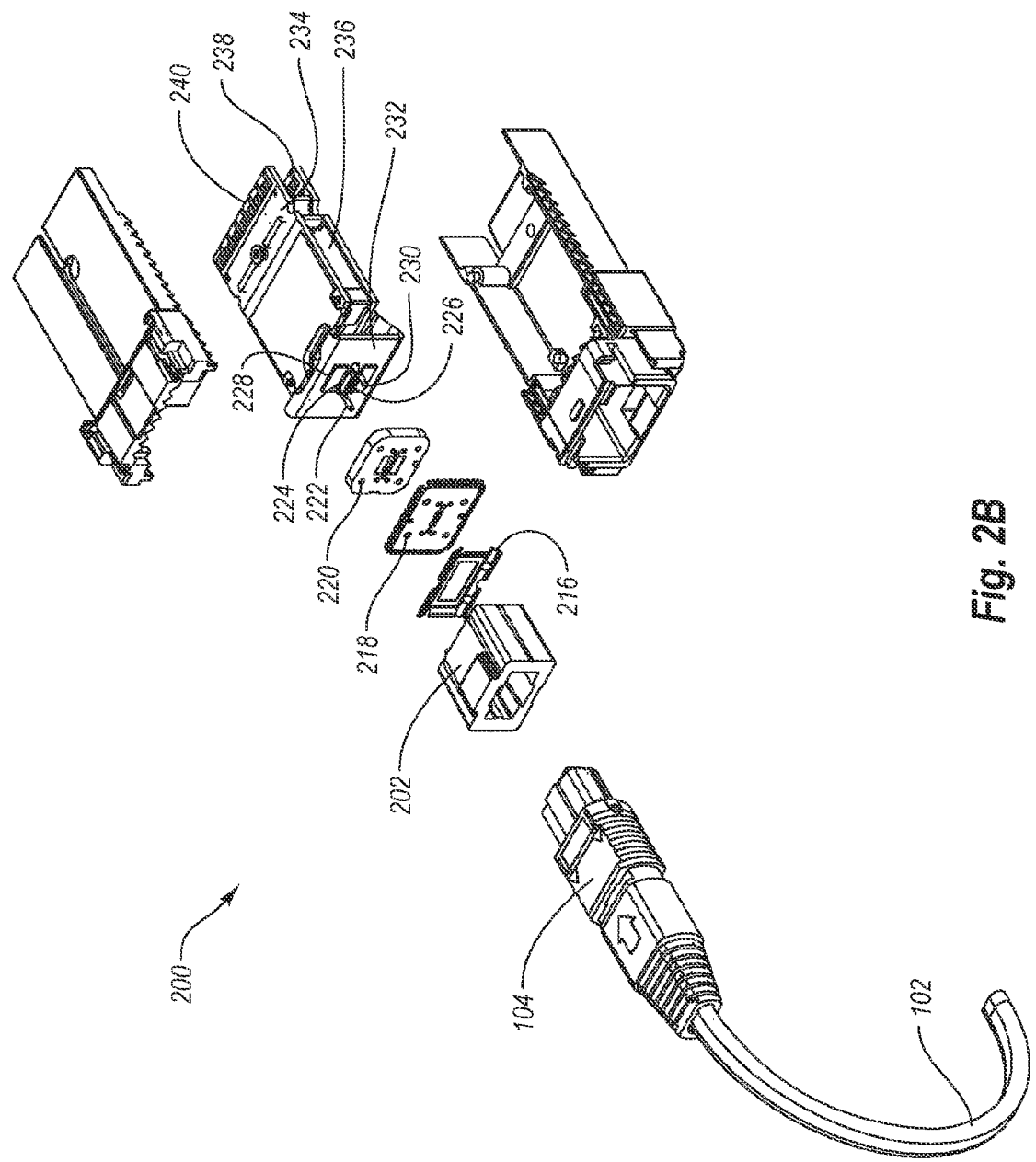
FIG. 2B is an exploded front top perspective view of the example transceiver module of FIG. 2A.

Example embodiments of the present invention relate to transceiver modules with dual printed circuit boards. Some example transceiver modules disclosed herein enable electrical data signals to be passed between a transmitter and a transmitter PCB and between a receiver and a receiver PCB, even where the generally parallel planes in which the PCBs are positioned are offset from the plane in which the transmitter and receiver are positioned.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Active Cable

Reference is first made to FIG. 1 which discloses an example active cable 100. The example active cable 100 is configured to physically connect two host devices together for optical and/or electrical data communication. The example active cable 100 includes a communications cable 102 and two identical transceiver modules 150 attached to the first and second ends of the communications cable 102.

The communications cable 102 can either be a single channel or multichannel communications cable. Further, the communications cable 102 can either be a fiber-optic communications cable or an electrical communications cable. For example, the communications cable 102 can include one or more optical or electrical data transmission lines. In some example embodiments, the communications cable 102 can be a fiber-optic ribbon communications cable having twenty four (24) fibers, with twelve (12) of the fibers being employed to transfer data signals in one direction, and the other twelve (12) fibers being employed to transfer data signals in the opposite direction. Alternatively, the communications cable 102 can be an electrical communications cables such as a Category 5 (CAT-5) cable.

As disclosed in FIG. 1, the communications cable 102 is permanently attached to each of the transceiver modules 150. However, it is understood that the communications cable 102 can alternatively be pluggably attached to one or both of the transceiver modules 150. For example, where the communications cable 102 is a fiber-optic communications cable, the communications cable 102 can be terminated on one or both ends with a multi-fiber push on (MPO) male connector and one or both of the transceiver modules 150 can include a corresponding MPO female connector configured to pluggably receive the MPO male connector. Alternatively, where the communications cable 102 is an electrical communications cable, the communications cable 102 can be terminated on one or both ends with a registered jack 45 (RJ-45) male connector and one or both of the transceiver modules 150 can include a corresponding RJ-45 female connector configured to pluggably receive the RJ-45 male connector.

With continuing reference to FIG. 1, each transceiver module 150 may include a handle and a latch (not shown) that can be employed to insert the transceiver module 150 into a cage of a host device (not shown) and to extract the the transceiver module 150 from the cage.

2. Example Transceiver Module

With reference now to FIGS. 2A and 2B, an example transceiver module 200 is disclosed. The example transceiver module 200 of FIG. 2A is identical to each of the example transceiver modules 150 of FIG. 1 except that the example transceiver module 200 is not permanently attached to the communications cable 102. In particular, the transceiver module 200 includes an MPO female connector 202 configured to pluggably receive an MPO male connector 104 attached to the fiber-optic communications cable 102.

The transceiver module 200 may include a handle and a latch as noted above in connection with the transceiver module 150 of FIG. 1. The transceiver module 200 further includes a mounting plate 216, an electromagnetic radiation shield 218, a lens block 220, alignment pins 222, a transmitter lens array 224, a receiver lens array 226, a transmitter 228, a receiver 230, a flexible circuit 232, a transmitter printed circuit board (PCB) 234, and a receiver PCB 236. The mounting plate 216 is attached to the MPO female connector 202. The electromagnetic radiation shield 218 is attached to the mounting plate 216 and function to limit or eliminate the electromagnetic radiation generated within the transceiver module 200. The lens block 220 is attached to the electromagnetic radiation shield 218 and holds the transmitter lens array 224 and the receiver lens array 226. The alignment pins 222 facilitate the alignment of the MPO female connector 222, the electromagnetic radiation shield 218, the lens block 220, and the transmitter lens array 224 and the receiver lens array 226. The transmitter 228 and the receiver 230 are physically and electrically connected to the flexible circuit 232, which is in turn physically and electrically connected to both the transmitter PCB 234 and the receiver PCB 236.

In operation, incoming optical data signals travel from the fiber-optic communications cable 102, through the MPO male connector 104, the MPO female connector 202, the electromagnetic radiation shield 218, the lens block 220, the receiver lens array 226, and are received by the receiver 230. The receiver 230 then converts the incoming optical data signal into electrical data signals. These electrical data signals are then passed along conductive traces (not shown) on the flexible circuit 232 to receiver circuitry (not shown) on the receiver PCB 236. After being refined by the receiver circuitry, these electrical data signals are then passed to the host device (not shown) into which the transceiver module 200 is positioned via an edge connector 238 on the back of the receiver PCB 236.

In operation, outgoing electrical data signals travel from the host device (not shown) into which the transceiver module 200 is positioned into the transceiver module 200 via an edge connector 240 on the back of the transmitter PCB 234. Transmitter circuitry (not shown) on the transmitter PCB 234 refines these electrical data signals before passing them along conductive traces (not shown) on the flexible circuit 232 to the transmitter 228. The transmitter 228 converts these electrical data signals into optical data signals before transmitting them through the transmitter lens array 224, the lens block 220, the electromagnetic radiation shield 218, the MPO female connector 202, and the MPO male connector 104, and into the fiber-optic communications cable 102. In this manner, the host device (not shown) into which the transceiver module 200 is positioned can communicate electronically with a distance host device. While the example PCBs 234 and 236 disclosed herein include circuitry (not shown) dedicated to the transmitter 228 and the receiver 230, respectively, it is understood that each PCB could instead include circuitry for both the transmitter 228 and the receiver 230.

The transmitter 228 may be an optical transmitter such as a vertical cavity surface emitting laser (VCSEL), or the like. The receiver 230 may be an optical receiver such as a photodetector, or the like. For example, the transmitter 228 may be a twelve (12) channel VCSEL array and the receiver 230 may be a twelve (12) channel PIN photodetector array. The transmitter 228 may be capable of satisfying the INFINIBAND standard for data transfer rates. For example, the transmitter 228 may be capable of emitting optical signals encoding data at a bit rate of up to 150 Gb/s, or greater. The transmitter 228 may also be capable of data rates as low as, or lower than, 1 Gb/s. In some embodiments, only the transmitter 228 or the receiver 230 is included in the transceiver module 200, such that the transceiver module 200 becomes only an optical transmitter or receiver, respectively.

The flexible circuit 232 may be "single sided" such that individual conductive traces are formed on only one side of the flexible circuit 232. The opposite side of the flexible circuit 232 may include a sheet of conductive material forming a ground contact and providing shielding. The use of a single sided flexible circuit 232 may allow the flexible circuit 232 to be bent more sharply while retaining its functionality as well as provide higher bit transfer rates.

Figure 2C:
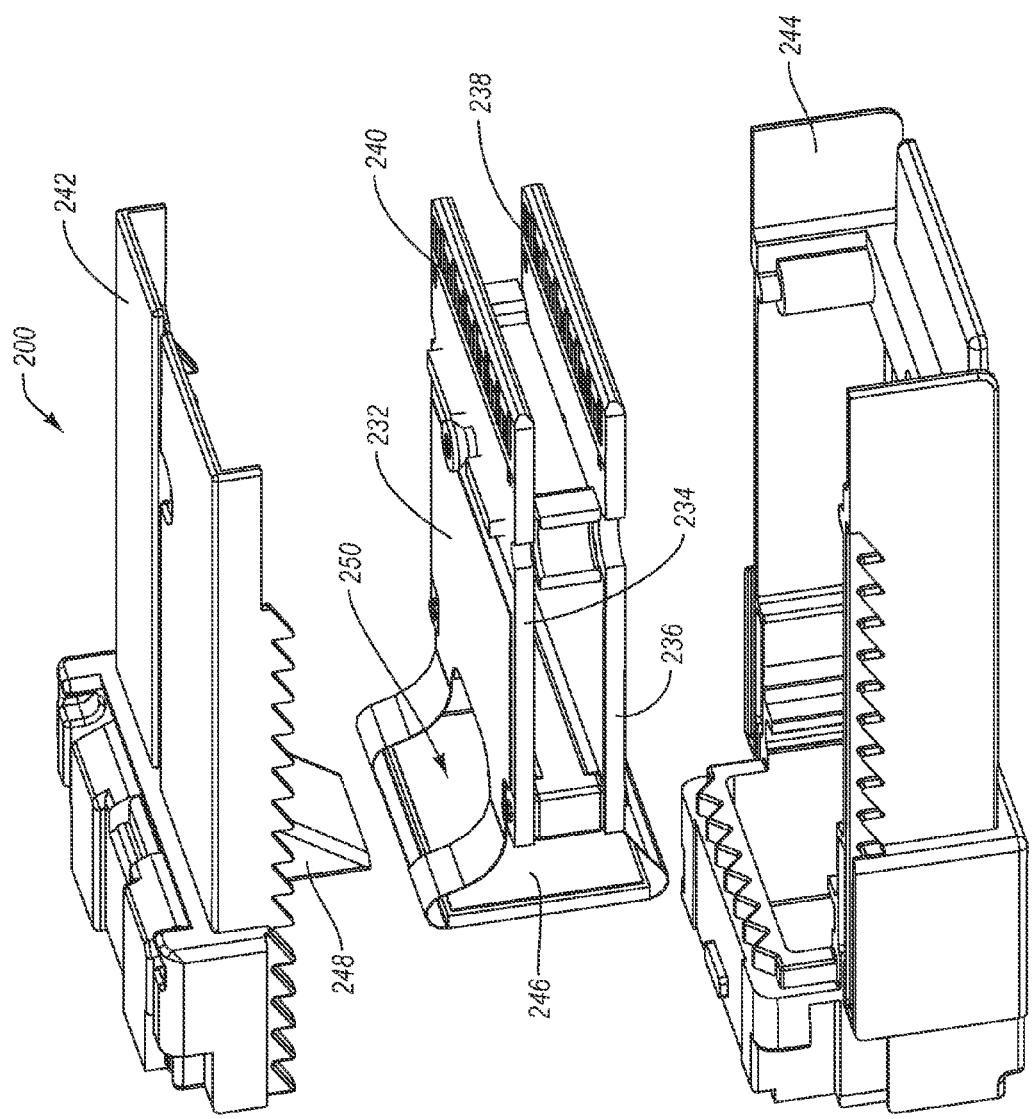
FIG. 2C is an exploded rear bottom perspective view of portions of the example transceiver module of FIGS. 2A and 2B.

With reference now to FIG. 2C, additional aspects of the example transceiver module 200 are disclosed. As disclosed in FIG. 2C, the transceiver module further includes a top shell 242 and a bottom shell 244. The bottom shell 244 may be formed from zinc, for example, and the top shell 242 may be formed from zinc or from a copper-tungsten material, for example. In some example embodiments, the top shell 242 functions as a heat spreader to dissipate the heat generated by the transmitter 228 and the receiver 230, disclosed in FIG. 2B. In particular, as heat is generated during the operation of the transmitter 228 and the receiver 230, this heat is conducted through the flexible circuit 232, through a conductive mounting plate 246, and into a protruding heat spreader 248 that is integrally formed as part of the top shell 242. This heat can then be dissipated into air flowing over the top of the top shell 242. The physical and thermal contact between the protruding heat spreader 248 and the conductive mounting plate 246 is facilitated by an opening 250 defined in the flexible circuit 232. It is noted that the conductive mounting plate 246 also functions in the transceiver module 200 as a heat spreader.

It is further noted that flexible circuit 232 may be attached to the conductive mounting plate 246 with a heat-cured thermal adhesive and a thermal compound may be placed between the conductive mounting plate 246 and the protruding heat spreader 248 in order to facilitate the transfer of heat from the operation of the transmitter 228 and the receiver 230. Further, one or more vias may be included in the flexible circuit 232 to facilitate the transfer of heat through the flexible circuit 232 where the flexible circuit 232 is made from a material that does not conduct heat well.

Figure 2D:
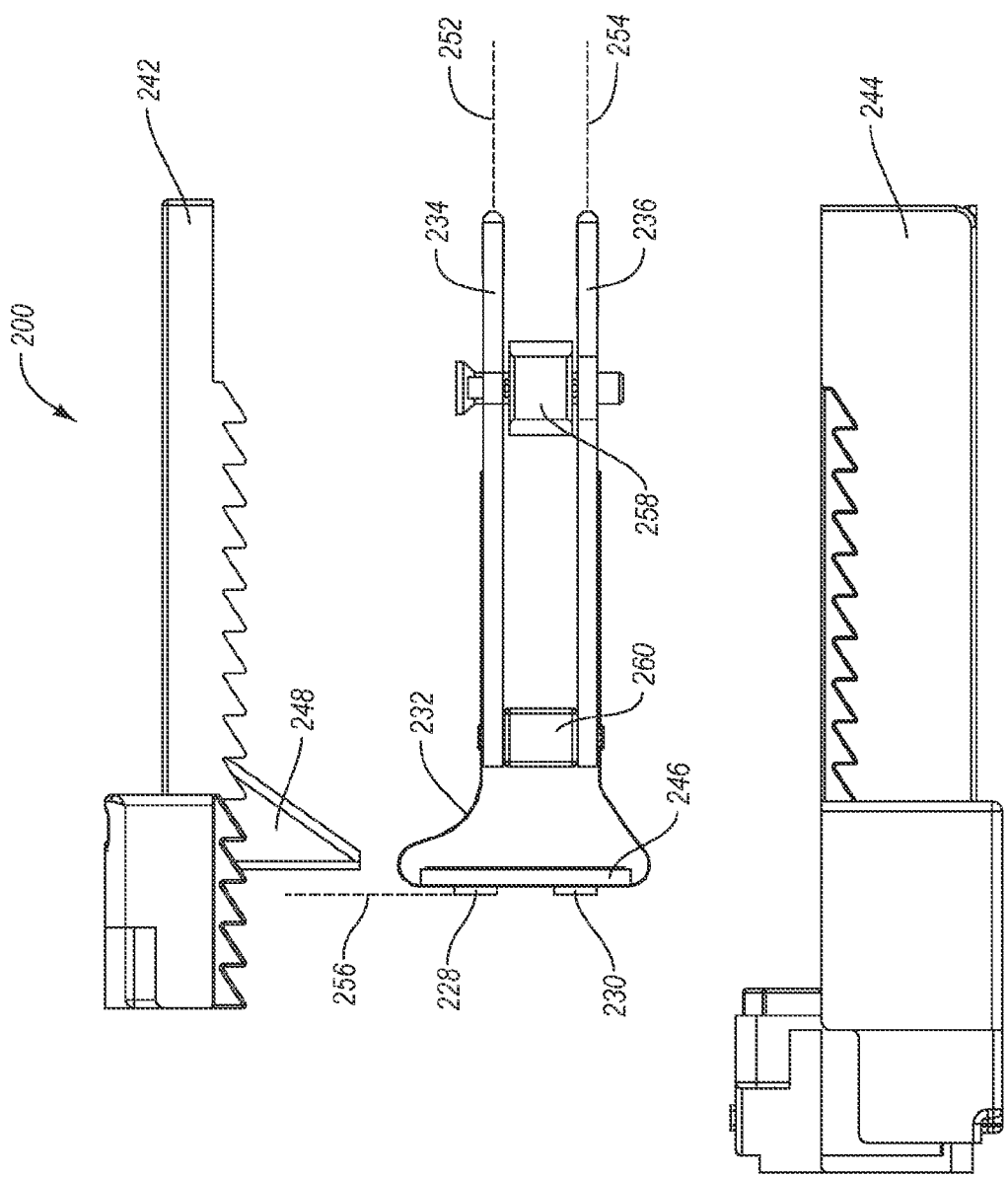
FIG. 2D is an exploded side perspective view of the portions of the example transceiver module of FIG. 2A and 2B disclosed in FIG. 2C.

With reference now to FIG. 2D, additional aspects of the example transceiver module 200 are disclosed. As disclosed in FIG. 2D, the transmitter PCB 234 is positioned in a first plane 252, the receiver PCB 236 is positioned in a second plane 254, and the transmitter 228 and the receiver 230 are both positioned in a third plane 256.

As disclosed in FIG. 2D, the third plane 256 is offset from the first and second planes 252 and 254 in that the third plane 256 is not parallel to either the first plane 252 nor the second plane 254. In particular, while the first plane 252 is substantially parallel to the second plane 254, the third plane 256 is substantially orthogonal to both the first plane 252 and the second plane 254. As disclosed in FIG. 2D, a pair of spacers 258 and 260 positioned between the transmitter PCB 234 and the receiver PCB 236 maintain the transmitter PCB 234 substantially parallel to the receiver PCB 236. It is noted however, that the transmitter PCB 234 need not be parallel to the receiver PCB 236, and the transmitter 228 and the receiver 230 need not be orthogonal to one or both of the transmitter and receiver PCBs 234 and 236. The planes in which the PCBs 234 and 236 are positioned may instead simply be offset from the plane in which the transmitter 228 and the receiver 230 are positioned.

Also disclosed in FIG. 2D is the facilitating position of the flexible circuit 232. In particular, the flexible circuit 232 extends over the top of the conductive mounting plate 246 to allow electrical data signals to pass between the transmitter PCB 234 and the transmitter 228 and also extends underneath the bottom of the conductive mounting plate 246 to allow electrical data signals to pass between the receiver 230 and the receiver PCB 236. The flexible circuit 232 is therefore one example structural implementation of a means for passing electrical data signals between the transmitter 228 and the transmitter PCB 234 and between the receiver 230 and the receiver PCB 236.

It is noted that a variety of means may be employed to perform the functions disclosed herein concerning the passing of electrical data signals between the transmitter 228 and the transmitter PCB 234 and between the receiver 230 and the receiver PCB 236. Thus, the flexible circuit 232 comprises but one exemplary structural implementation of a means for passing of electrical data signals between the transmitter 228 and the transmitter PCB 234 and between the receiver 230 and the receiver PCB 236.

Accordingly, it should be understood that such structural implementations are disclosed herein solely by way of example and should not be construed as limiting the scope of the present invention in any way. Rather, any other structure or combination of structures effective in implementing the functionality disclosed herein may likewise be employed. By way of example, in some embodiments of the transceiver module 200, two or more flexible circuits can be employed and can be positioned differently from the flexible circuit 232. For example, one or more flexible circuits can be wrapped around the sides of the mounting plate 246, or could pass through one or more slots in the mounting plate 246. Further, although the transmitter PCB 234 and the receiver PCB 236 are disclosed as being sandwiched between the flexible circuit 232, it is understood that the flexible circuit could instead be sandwiched between the transmitter PCB 234 and the receiver PCB 236 or interleaved with the transmitter PCB 234 and the receiver PCB 236.

The example embodiments disclosed herein may be embodied in other specific forms. The example embodiments disclosed herein are to be considered in all respects only as illustrative and not restrictive.

What is claimed is:

1. A transceiver module comprising:
a shell defining a protruding heat spreader;
a first printed circuit board (PCB) positioned in a first plane;
a second PCB positioned in a second plane;
a transmitter and a receiver both positioned in a third plane that is offset from the first and second planes;
a conductive mounting plate;
a flexible circuit comprising conductive traces that allow electrical data signals to pass between the transmitter and the receiver and the first and second PCBs, a portion of the flexible circuit sandwiched between the transmitter and receiver and the conductive mounting plate, and another portion of the flexible circuit defining an opening surrounding the protruding heat spreader and permitting the protruding heat spreader to physically and thermally contact the conductive mounting plate.

2. The transceiver module as recited in claim 1, wherein the first PCB includes circuitry corresponding to the transmitter and the second PCB includes circuitry corresponding to the receiver.

3. The transceiver module as recited in claim 1, wherein the first plane is substantially parallel to the second plane.

4. The transceiver module as recited in claim 3, wherein the third plane is substantially orthogonal to the first plane and the second plane.

5. The transceiver module as recited in claim 4, wherein at least a portion of the flexible circuit is positioned between the first PCB and the second PCB.

6. The transceiver module as recited in claim 1, further comprising a multifiber push on (MPO) female connector attached to the transceiver module.

7. The transceiver module as recited in claim 1, further comprising an electrical communications cable attached to the transceiver module.

8. The transceiver module as recited in claim 1, wherein the conductive mounting plate is positioned in a plane that is substantially parallel to the third plane.

9. The transceiver module as recited in claim 1, wherein the flexible circuit is attached to the conductive mounting plate with a heat-cured thermal adhesive.

10. The transceiver module as recited in claim 1, wherein a thermal compound is positioned between the conductive mounting plate and the protruding heat spreader.

11. The transceiver module as recited in claim 1, wherein the portion of the flexible circuit sandwiched between the transmitter and receiver and the conductive mounting plate includes one or more vias to facilitate the transfer of heat through the flexible circuit from the transmitter and receiver to the conductive mounting plate.

12. An active cable comprising:
    a communications cable comprising one or more optical or electrical data transmission lines, the communications cable having first and second ends; and
    first and second transceiver modules attached to the first and second ends of the communications cable, respectively, each transceiver module comprising:
        a shell defining a protruding heat spreader;
        a first PCB positioned in a first plane;
        a second PCB positioned in a second plane;
        a transmitter and a receiver both positioned in a third plane that is offset from the first and second planes; and
        a conductive mounting plate;
        a flexible circuit comprising conductive traces that allow electrical data signals to pass between the transmitter and the receiver and the first and second PCBs, a portion of the flexible circuit sandwiched between the transmitter and receiver and the conductive mounting plate, and another portion of the flexible circuit defining an opening surrounding the protruding heat spreader and permitting the protruding heat spreader to physically and thermally contact the conductive mounting plate.

13. The active cable as recited in claim 12, wherein the first PCB includes circuitry corresponding to the transmitter and the second PCB includes circuitry corresponding to the receiver.

14. The active cable as recited in claim 12, wherein the first plane is substantially parallel to the second plane.

15. The active cable as recited in claim 14, further comprising one or more spacers positioned between the first PCB and the second PCB that maintains the first PCB substantially parallel to the second PCB.

16. The active cable as recited in claim 12, wherein the third plane is substantially orthogonal to the first plane and the second plane.

17. The active cable as recited in claim 12, wherein at least portions of the transmitter PCB and the second PCB flexible circuit are positioned between the flexible circuit.

18. The active cable as recited in claim 12, wherein the conductive mounting plate is positioned in a plane that is substantially parallel to the third plane.

19. The active cable as recited in claim 12, wherein:
    the flexible circuit is attached to the conductive mounting plate with a heat-cured thermal adhesive; and
    a thermal compound is positioned between the conductive mounting plate and the protruding heat spreader.

20. The active cable as recited in claim 12, wherein the portion of the flexible circuit sandwiched between the transmitter and receiver and the conductive mounting plate includes one or more vias to facilitate the transfer of heat through the flexible circuit from the transmitter and receiver to the conductive mounting plate.

* * * * *